(12) United States Patent
Gao et al.

(10) Patent No.: US 7,772,842 B2
(45) Date of Patent: Aug. 10, 2010

(54) DEDICATED SUPERCONDUCTOR MRI IMAGING SYSTEM

(75) Inventors: Erzhen Gao, Millburn, NJ (US); Qiyuan Ma, Shanghai (CN); Sze Man Yeung, Hong Kong (CN)

(73) Assignee: Time Medical Holdings Company Limited, George Town (KY)

( * ) Notice: Subject to any disclaimer, the term of this patent is extended or adjusted under 35 U.S.C. 154(b) by 0 days.

(21) Appl. No.: 12/212,147

(22) Filed: Sep. 17, 2008

(65) Prior Publication Data

US 2010/0066368 A1     Mar. 18, 2010

(51) Int. Cl.
*G01V 3/00* (2006.01)
(52) U.S. Cl. ...................................... 324/307
(58) Field of Classification Search .......... 324/300–322
See application file for complete search history.

(56) References Cited

U.S. PATENT DOCUMENTS

| | | | |
|---|---|---|---|
| 5,066,915 A | 11/1991 | Omori et al. | |
| 6,661,229 B2 | 12/2003 | Weyers et al. | |
| 6,836,117 B2 | 12/2004 | Tamura et al. | |
| 6,838,880 B2 * | 1/2005 | Hofmann et al. | 324/318 |
| 6,943,550 B2 | 9/2005 | Cheng et al. | |
| 6,975,115 B1 | 12/2005 | Fujita et al. | |
| 7,015,692 B2 | 3/2006 | Clarke et al. | |
| 7,260,941 B2 | 8/2007 | van Hasselt et al. | |
| 7,378,848 B2 | 5/2008 | Gao et al. | |
| 7,408,353 B2 * | 8/2008 | Marek et al. | 324/318 |
| 7,514,922 B2 * | 4/2009 | Freytag | 324/307 |
| 2007/0013377 A1 | 1/2007 | Wosik et al. | |
| 2008/0127416 A1 | 6/2008 | Tigwell et al. | |

OTHER PUBLICATIONS

U.S. Appl. No. 60/537,782, filed Jan. 20, 2004, Wosik, Jaroslaw et al.

"FDA Guidelines for Magnetic Resonance Equipment Safety", Center for Devices and Raiological Health, FDA, 2002.
"Superconducting Receive Coils for a Compact Low Field MRI System", Neil Alford, Physical Electronics and Materials, http://ecce1.lsbu.ac.uk/research/pem/MRI.html.
"HTS Volume Coil with Improved Imaging Volume", S.Y.Chong, ISMRM, 2008.
"The NMR phased array", P. B. Roemer, W. A. Edelstein, C. E. Hayes, S. P. Souza, and O. M. Mueller, Magn. Reson. Med, vol. 16, pp. 192-225, 1990.
"A Liquid Helium-Cooled RF Coil and DC Squid Amplifier for MRI at 0.01 T," H. C. Seton, D. M. Bussell, and J. M. S. Hutchison, Proc. Soc. Mag. Reson., vol. 2, p. 959, 1995.
"Investigation of a whole-body receiver coil operating at liquid nitrogen temperatures," A. S. Hall et al., Magn. Reson. Med., vol. 7, p. 230, 1988.
"Magnetic Superconducting Coils for Space and Clinical Applications" Wosik, Jaroslaw et al., University of Houston-Clear Lake • ISSO Annual Report Y2002 pp. 105-108.

* cited by examiner

*Primary Examiner*—Brij B Shrivastav
*Assistant Examiner*—Dixomara Vargas
(74) *Attorney, Agent, or Firm*—Yuanqing Jiang

(57) ABSTRACT

The present invention relates to dedicated superconductor magnetic resonance imaging (MRI) RF apparatus and method of constructing the same. One Embodiment of the present invention provides an MRI breast imaging apparatus comprising an examination region, a patient support, at least one vacuum thermal isolation housing, a main magnet system, and a cryogenic system. The vacuum thermal isolation housing comprises a low vacuum space between at least one inner and an outer high vacuum enclosure. The low vacuum space hosts at least one superconductor RF coil and a heat sink assembly therein. The RF coil is in thermal contact with the heat sink assembly that is coupled to the cryogenic system through a heat pipe to achieve and maintain a desired low temperature at the superconductor RF coil. The system provides a local examination region substantially surrounded by the superconductor RF coil.

29 Claims, 9 Drawing Sheets

DEDICATED SUPERCONDUCTOR MRI IMAGING SYSTEM

FIELD OF INVENTION

The present invention relates to superconductor magnetic resonance imaging (MRI) apparatus and method of constructing the same.

BACKGROUND OF INVENTION

Magnetic resonance imaging (MRI) is a noninvasive medical imaging technique widely used in radiology to visualize the structure and function of a human body or a living object. Because MRI scanner is able to create excellent images of various kinds of tissues of the body, especially the soft tissue due to the water content differences in those tissues, it provides doctors useful diagnostic information pertaining all parts of the body such as nervous system, musculoskeletal system, cardiovascular system, digestive system, and urinary reproductive system. This technique is particularly advantageous for early detection and treatment of stroke, real-time observation of cardiovascular function, and diagnosis of tumors and cancer. In addition, it is an exceptional tool for orthopedic injury diagnosis and surgery for man and animal alike. It can also perform in vivo chemical analysis through spectroscopy.

During an examination, a patient's body is placed within the examination region and is supported by a patient support in an MRI scanner where a substantially constant and uniform primary magnetic field is provided by a primary magnet. The magnetic field aligns the nuclear magnetization of precessing hydrogen atoms (protons) in water in the body. Typically, there is a radio frequency (RF) coil and a gradient coil assembly within the magnet. The radio frequency coil produces an excitation frequency pulse that temporarily creates an oscillating transverse magnetization which is detected by the radio frequency coil and used by a computer system to create an image of the part of the body under examination.

To map the body precisely, magnetic field gradients is applied so that the magnitude of the magnetic field varies with location inside the examination region characteristics of the magnetic resonance signals from different locations within the region, such as the frequency and phase of the signals, can be made to vary in a predictable manner depending upon position within the region.

People have been pursuing better quality MRI imaging relentlessly since the inception of MRI in 1977. Similarly, imaging speed to minimize imaging blurring caused by patient movement or nature movement such as blood flow during imaging process is also improved. Several factors contribute to better MRI image quality in terms of high contrast and resolution. One of the critical parameter, signal-to-noise ratio (SNR), determines the image quality. Increasing SNR by increasing the signal before the pre-amplifier of the MRI system is important in terms of increasing the quality of the image. SNR is defined as the power ratio of signal and noise.

$$SNR = P_{signal}/P_{noise} \quad \text{(Equation 1)}$$

wherein $P_{signal}$ and $P_{noise}$ are the power of signal and noise, respectively.

In an MRI system, RF coils function as transmitters to apply magnetic field pulses that excite the nuclear (proton) spins. Meanwhile, the coils function as receivers to receive the weak free induction signal. The transmitter design is not nearly as crucial as the receiver design for achieving good image quality. In some cases, the same coil serves as both the transmitter and receiver to avoid the electronic switching between transmit and receive modes of operation (M. A. Foster, J. M. S. Hutchison, Practical NMR Imaging IRL Press Ltd. p 34, 1987). However, criteria of an ideal transmission coil conflict with those of the receiver coil. Therefore in most situations separate transmission coils and receiver coils are used in an MRI system.

One way to improve SNR is to increase the strength of the magnet as the SNR is proportional to the magnitude of the magnetic field. The magnitude of magnetic field in MRI is usually measured in the unit of tesla (T), of which 1 tesla equals 10,000 gauss. FDA (Food and Drug Administration) has limited the magnitude of magnetic field of MRI scanner to less than 4 tesla for use in medical imaging (FDA Guidelines for Magnetic Resonance Equipment Safety", Center for Devices and Raiological Health, FDA, 2002).

Another way to improve SNR is to reduce noises. Since there is an upper limitation of the strength of magnetic field for human MRI, it is more sensible to reduce noise.

Noises can be categorized to body (sample) noise created by patient's body and coil noise created by the coils.

$$P_{noise} = P_{signal\text{-}noise} + P_{coil\text{-}noise} \quad \text{(Equation 2)}$$

wherein $P_{signal\text{-}noise}$ and $P_{coil\text{-}noise}$ are sample and coil noise, respectively. Using (1) and (2), one can obtain $$SNR = P_{signal}/(P_{signal\text{-}noise} + P_{coil\text{-}noise}) \quad \text{(Equation 3)}$$

In equation 3, the signal is inversely proportional to the square of the distance between the coil and the sample; the sample noise is proportional to the volume of the sample (body) or field of view (FOV). The larger the sample is, the higher the sample noise will be. On the other hand, coil noise is a function of conductance of the coil, which is determined by materials of the coil and the temperature of the coil. (Neil Alford: "Superconducting Receive Coils for a Compact Low Field MRI System", in: Physical Electronics and Materials, http://eccel.lsbu.ac.uk/research/pem/MRI.html).

A lot of research work has been done on reducing both sample (body) noise and coil noise to improve MRI image quality. However, current art of general purpose MRI scanners have intrinsic shortcomings. A general purpose scanner has large magnets and large coils in order to scan the whole body of a patient. The large magnets provide large coverage of scanning area which is suitable for all kinds of tissue in all parts of the body. Large coils have large FOVs and create high sample noise and coil noise. In order to shorten the distance from coil to the patient's body and increase the signal strength, the coils are positioned around the patient closely, making the examination region of the scanner wrapping the patient tightly, which is often the reason of claustrophobia complaint from the patient. Most of the time, doctors are interested in examining certain organ in certain part of the patient's body using different types of the coils such as general purpose surface coil, knee coil, breast coil, head coil, spine coil, and array coil. The coils can be designed to fit to the shapes of the organs to be examined, and are positioned much closer to the organs so that the signal strength will be increased. All of the current RF coils are made of metallic material such as copper. Coils are detachable from the magnet and placed into the magnet one coil at a time to image individual organ.

A high SNR in clinic MRI imaging could be achieved by design and making better RF coils. Previous work done ("HTS Volume Coil with Improved Imaging Volume", S. Y.

Chong, ISMRM, 2008) by research groups has demonstrated that SNR can be increased by as much as 300-500% using the superconductor materials, particularly the high temperature superconductor (HTS) such as YiBaCuO, BiSrTiCaO, et al. The drawback of the superconductor coil is that one has to use a bulky cryogenic subsystem in order to operate the superconductor coil. So far, all the HTS coils demonstrated are also detached from the MRI machine. In clinical applications, the superconducting coil subsystem has to be installed and detached back or forth for imaging of individual organ. With the bulky cryogenic subsystem, it is very troublesome to do the installation which limits the application. Many old designs for the general purpose scanner such as coils, cryogenic (cooling) system for the coils, the housing for the coils and the patient support are no longer suitable for the new, high performance MRI system.

SUMMARY OF THE INVENTION

One objective in accordance with the present invention is to construct a dedicated MRI imaging apparatus with a high quality superconductor imaging coil integrated with a cryogenic system to improve imaging quality.

Another objective is to provide a compact MRI imaging system with a local examination region to improve signal-to-noise ratio.

A further objective is to improve efficiency of MRI imaging procedure with a fixed coil system for patients in a clinic environment.

In particular, and by way of example only, according to an embodiment, provided is an magnetic resonance imaging (MRI) apparatus comprising: an examination region, at least one vacuum thermal isolation housing, a main magnet system for generating a main magnetic field in the examination region, and a cryogenic system integrated with the vacuum thermal isolation housing. The vacuum thermal isolation housing comprises a low vacuum space at a pressure between $10^{-3}$ to $10^{-6}$ Torr, at least one superconductor RF coil, a heat sink assembly, and at least one inner and an outer high vacuum enclosures. The high vacuum enclosure comprises a double wall hermetically sealed high vacuum jacket at a pressure of $10^{-6}$ to $10^{-9}$ Torr. The vacuum thermal isolation housing provides at least one local examination region that is substantially surrounded by the superconductor RF coil. The low vacuum space, which is between the inner and the outer high vacuum enclosures, hosts the at least one superconductor RF coil that is in thermal contact with the heat sink assembly. The heat sink assembly is coupled to the cryogenic system through a heat pipe to achieve and maintain a desired low temperature at the superconductor RF coil.

It is to be understood that both the foregoing general description and the following detailed description are exemplary and explanatory and are intended to provide further explanation of the invention as claimed.

BRIEF DESCRIPTION OF THE DRAWINGS

A more complete appreciation of the invention and many of the attendant advantages thereof will be readily obtained and understood by referring to the following detailed description and the accompanying drawings in which like reference numerals denote like elements as between the various drawings. The drawings, briefly described below, are not to scale.

DETAILED DESCRIPTION OF THE INVENTION

Figure 1:
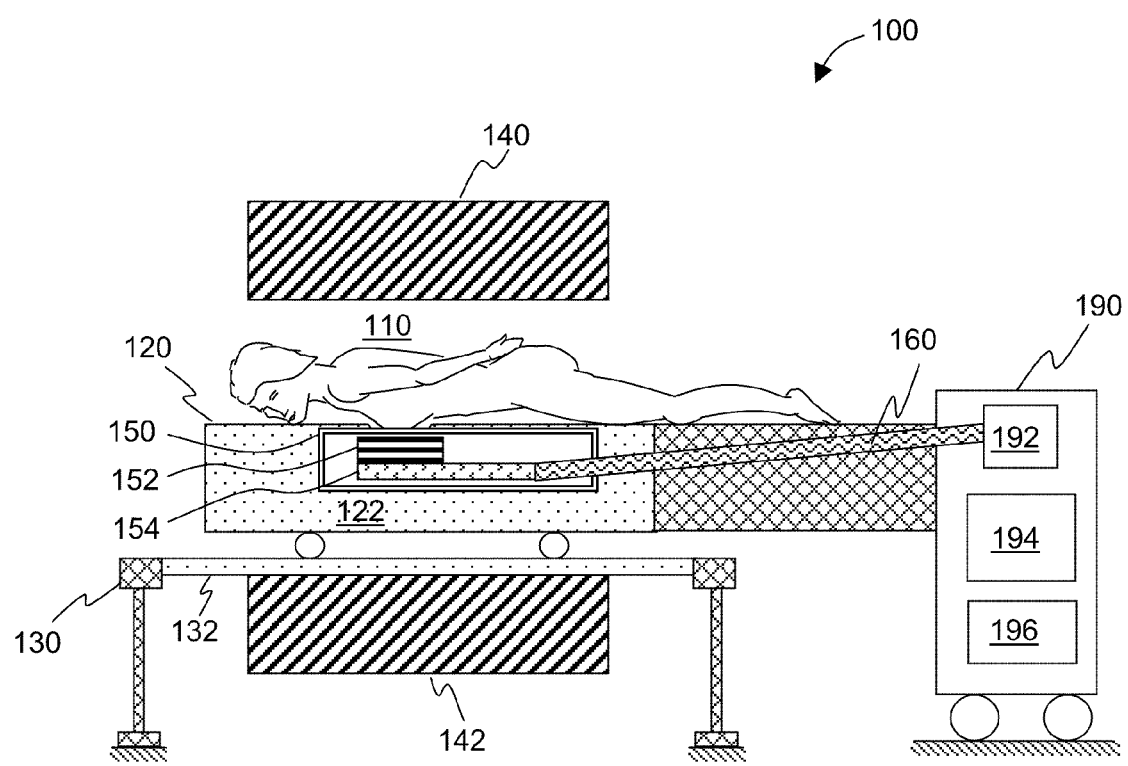
FIG. 1 illustrates an MRI apparatus for breast imaging in according to one embodiment of the present invention.

In view of the forgoing problems with conventional MRI RF systems, new designs of dedicated MRI apparatuses are needed. A dedicated MRI system requires a local examination region. According to Equation 2, when the examination volume is reduced, the noise level will be reduced. Small surface coils can achieve a higher SNR because they receive noise from a small sample volume. The disadvantage of small surface coils, however, is a limited FOV and an inhomogeneous spatial uniformity as a transmitter. Larger coils with inherently larger FOVs have the advantage of improved uniformity. It is therefore advantageous to have a two-coil system. A larger coil will be used to transmit while the superconductor coil is used as the receive coil.

Phased array surface coils have been developed to overcome the problem of decreased FOV. Phased array surface coil consists of multiple non-interacting coils, which provides a similar SNR as a small coil and an FOV associated with a larger coil (P. B. Roemer, W. A. Edelstein, C. E. Hayes, S. P. Souza, and O. M. Mueller "The NMR phased array," Magn. Reson. Med. Vol. 16, pp 192-225, 1990). Phased array extremity coils which are used for scan limbs can offer an improvement of SNR over the body coil, these coils may be employed for larger FOV imaging of the joints and spine.

Another disadvantage of surface coils is limited depth of tissue penetration, irrespective of if the coils are used alone or in a phased array. The Helmholtz pair configuration overcomes this limitation by acquiring the superficial signal from two sides of the sample (body) of interest. The penetration of two diametrically opposed coils compensates for the limited penetration of each individual coil.

In additional to reducing the volume of the examination region, the SNR ratio can be further improved by placing the RF coil as close to the body part of a patient to be examined as possible.

To further improve SNR, it is desired to select proper materials for making the coil and to reduce the temperature of the coil for increasing the conductance of the coil (reducing its resistance) and to improve SNR. Currently copper coils and superconductor RF coils are commonly used for MRI. Some studies have focused on lowering the thermal noise of copper receive coils by decreasing the operating temperature of the coil (H. C. Seton, D. M. Bussell, and J. M. S. Hutchison, "A Liquid Helium-Cooled RF Coil and DC SQUID Amplifier for MRI at 0.01 T," Proc. Soc. Mag. Reson., vol. 2, p. 959, 1995) (A. S. Hall, B. Barnard, P. McArthur, D. J. Gilderdale, I. R. Young, and G. M. Bydder, "Investigation of a whole-body receiver coil operating at liquid nitrogen temperatures," Magn. Reson. Med., vol. 7, p. 230, 1988). The power of coil noise, described as the Johnson noise, is proportional to the product of temperature and resistance. Cool the temperature of the conventional copper RF coil reduces thermal noise (Johnson noise) from the coil, and the cooled coil is called cryogenic coil which is inside a thermal isolation housing with at least one heat sink and is coupled to a cryogenic system through a heat pipe or other thermally conductive device for conduct heat away to achieve and maintain a desired low temperature of the coil.

Coils are often characterized by a quality factor (Q) which is a measurement of the amount of energy stored compared to the losses in the coil. In the case when coil-noise is dominant, the SNR is proportional to the square root of Q/T, wherein Q is the quality factor of a resonator or a coil, and T is the coil temperature. The Q value of a copper coil is usually up to a few hundred when it is operated at room temperature (300 K). In comparison, a coil fabricated from HTS (High Temperature Super conducting) material, operating at 77 K, can increase the Q value by 2-3 orders of magnitude (J. R. Miller, K. Zhang, Q. Y. Ma, I. K. Mun, K. J. Jung, J. Katz, D. W. Face, and D. J. Kountz "High sensitivity sodium receiver coils for magnetic resonance imaging" IEEE Trans. Biomedical Engineering. Vol 43, p 1997-99, 1996). It can be appreciated that a superconductor coil has much higher sensitivity resulting in a higher SNR which can be used to reduce the imaging time in the cases when a short imaging time of MRI is critical.

Therefore, a further reduction of the coil resistance is to implement superconductor material for RF coil construction. The resistance of a superconductor material is several orders lower than that of copper. Using a superconductor as the coil material is a promising way to reduce coil noise, and increase SNR. High temperature superconducting (HTS) material at liquid nitrogen temperature (77 K) provides extremely low conductivity loss compared to that of conventional copper coil. Research has shown significant improvement of MRI image quality with SNR approximately improved by a factor of three due to the use of superconductor RF coils; therefore, it is believed that superconductor RF coils can offer potential applications in the area of MRI. For example, U.S. Pat. No. 6,943,550 and U.S. provisional application 60/537,782 disclose high temperature superconductor (HTS) RF coils for MRI imaging. And the materials for making the coils can be copper, silver, thin film or thick film $YBa_2Cu_3O_7$ (YBCO) ect. HTS material such as YBCO, provides an extremely low resistance at a temperature below their critical temperatures (Tc, 89 K for YBCO).

An MRI breast imaging apparatus in accordance with at least one embodiment of the invention is illustrated in FIG. 1. The apparatus 100 includes an examination region 110, a movable patient bed 120, a supporting structure 130, a main magnet system including an upper magnet 140 and lower magnet 142, and a cryogenic system 190. The main magnet system generates a substantially uniform magnetic field in the range of 0.1 T to 3 T in the examination region. The direction of low magnetic field can be arranged to a desirable direction, for example, perpendicular to the patient bed, while the direction of high field is usually horizontal.

The movable bed 120 can be slid on the supporting structure to load and carry a patient in and out of the examination region. The portion of the bed 122 and supporting structure 132 or most part of them which are located in the main magnetic field are made of non-metallic and non-magnetic material such as plastic.

A vacuum thermal isolation housing 150 is located proximate to the upper surface of the patient bed. The vacuum housing encloses at least one superconductor RF coil 152 which is in thermal contact with a heat sink assembly 154. A heat pipe 160 is located between the vacuum housing and the cryogenic system. One end of the heat pipe is extended into the vacuum housing and coupled to the heat sink assembly 154. The other end of the heat pipe is connected to the cryogenic system 190, which includes a heat exchanger 192, a cryocooler 194, and a compressor package 196. At least a portion of the cryogenic system is movable with the patient bed.

Several advantages of integrating the superconductor RF coils and the cryogenic system with the patient bed can be recognized. One advantage is that, when the RF coil is fixed with the bed, the coil is close to the part of the subject body to be examined. This will improve the signal to noise ratio, thereby providing a better image quality. Another advantage is to provide a reliable and efficient imaging procedure in a clinic environment. Since the coils are fixed within the bed, there is no need to install and recalibrate the coil for each patient. In addition, embedding the cryogenic system within the patient supporting system provides efficient cooling to satisfy the requirement of operating the superconductor RF coils at a temperature below the superconducting critical point.

There are, however, a number of challenges in constructing the integrated superconductor MRI system. Since the examination region is compact, it is difficult to arrange a cooling system for the superconductor RF coils. Also, the examination region is in the uniform main magnetic field, construction materials in this region have to be non-magnetic. Conventional cooling techniques are no longer suitable for the system illustrated in FIG. 1. For example, one cooling method for superconductor MRI coil is described by U.S. Pat. No. 7,015,692, in which the MRI probe is cooled by circulating cryogenic fluid. However, this method requires refill cryogenic fluid, which is not convenient in a clinic setting. Another thermal isolation and cooling method is disclosed by U.S. Pat. No. 7,408,353, in which superconductor RF coils are placed in a vacuum to maintain a low temperature. The vacuum is connected to a high vacuum pumping line to maintain a low pressure. In practice, it is difficult to arrange a high vacuum pumping system in a compact environment. In addition, it is difficult to minimize vacuum leaks due to a number of seals for the feed through to the vacuum system. Furthermore, a high vacuum environment requires special materials that are non-volatile and have a low out-gassing rate. The high vacuum requirement combined with the non-magnetic requirement make material selection for RF coils and heat sink assembly very limited.

Figure 2A:
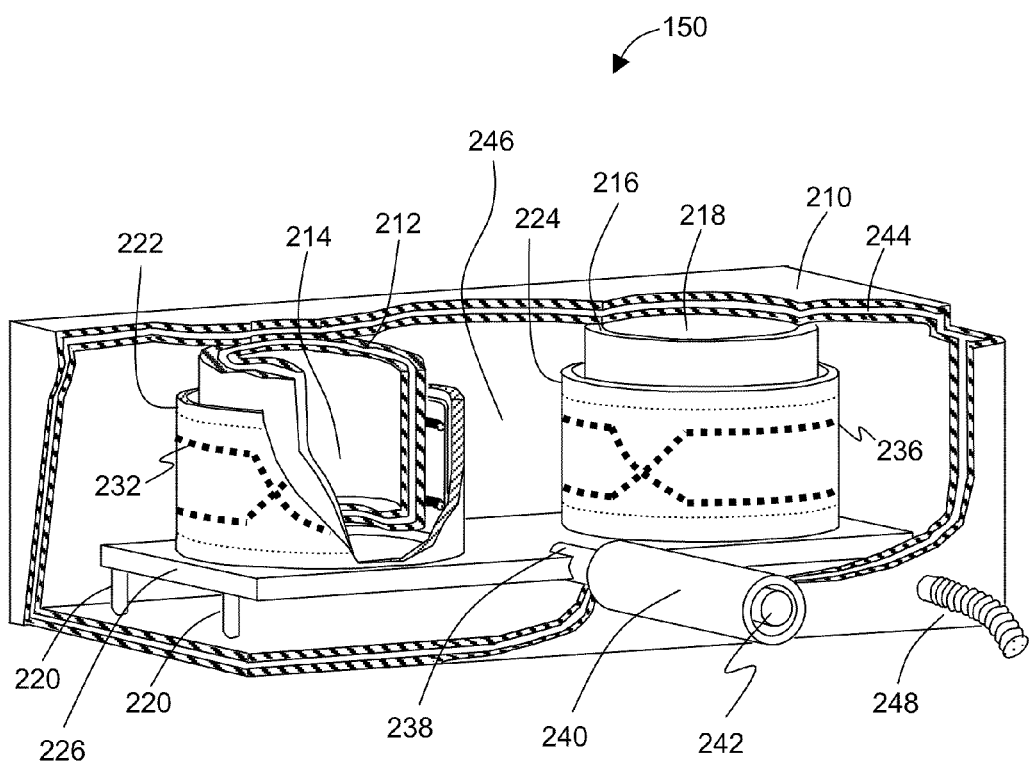
FIG. 2A shows a perspective view of the vacuum thermal isolation housing of FIG. 1.

The above problems are solved by the present invention. In accordance with one embodiment of the present invention, provided is the vacuum thermal isolation housing 150 as shown in FIGS. 1 and 2. FIG. 2A is a perspective view of an exemplary vacuum thermal isolation housing 150. The vacuum thermal isolation housing provides two local examination regions 214 and 218 for both breast imaging. The local examination region 214 and 218 are substantially surrounded by superconductor RF coils 232 and 236 respectively, which provide a high imaging quality. The vacuum thermal isolation housing comprises two inner high vacuum enclosures, such as high vacuum cylinders 212 and 216 respectively, and an outer high vacuum enclosure 210. The high vacuum enclosure comprises a double wall hermetically sealed high vacuum jacket at a pressure of $10^{-6}$ to $10^{-9}$ Torr. An exemplary method to construct the high vacuum panel is to mold a double wall enclosure of a desired shape having a pumping outlet and optional spacers made of a thermal insulator such as glass or other ceramic between the walls. A typical gap 244 of the vacuum jacket is in a range of 1 mm and 100 mm. The enclosure is then evacuated to a high-grade vacuum in a range of $10^{-6}$ to $10^{-9}$ Torr, followed by sealing off the pumping outlet. To hold this high-grade vacuum for many years, the seams have to be sealed with perfectly leak-proof quality, preferably by welding. Preferred materials for the high vacuum enclosure include G10 fiberglass, glass, glass composites, or a combination of these materials. As known, these materials are non magnetic and will not interfere with the magnetic fields in the examination region.

Referring again to FIG. 2A, a low vacuum space 246 at a pressure between $10^{-3}$ to $10^{-6}$ Torr is formed between the inner and outer high vacuum enclosures. Elements for sealing the high vacuum panels in order to form the low vacuum space include O-ring, gasket, grease, or epoxy. A vacuum pumping line 248 is connected to the low vacuum space to create and maintain the vacuum pressure. A heat sink assembly 154, supported by several thermal insulators 220, is mounted in the low vacuum space. Materials suitable for making the heat sink assembly include ceramic such as alumina, plastic, crystals such as sapphire and metal, and glass. In one embodiment, the heat sink assembly 154 is formed by two cylinders 222 and 224 mounted on a plate 226. Heat sink cylinder 222 and 224 are close but not in contact to the inner high vacuum enclosures. A typical gap between the heat sink and the inner high vacuum enclosure is about 1 to 10 mm. Typical dimensions of the heat sink cylinder is about 100-200 mm in diameter and 100-150 mm tall.

RF coil 232 and 236 are mounted on the surface of each heat sink cylinders 222 and 224 respectively. It is preferred to mount the coil on the inner surface of the heat sink cylinder in order to get the coil close to the local examination region. In order to effectively cool the superconductor coil below the critical temperature to reach the superconducting state, the coil sheet is in good thermal contact with the surface of the heat sink. The heat sink assembly 154 joints the heat pipe by a cold head 238.

The cold head 238 can be made by a copper block to provide an adequate cooling capacity to cool the superconductor RF coil. Although, a metal block in the magnetic field may cause interference, the interference is negligible when the metal block is small and the magnetic field is below 3 T.

In this configuration, the superconductor RF coil is mounted on a curved surface (on a cylinder) and it is in a good thermal contact with the heat sink. A suitable form of the superconductor coil for this application is a superconductor tape made by, for example, Bismuth Strontium Copper Oxides (BSCCO). Detailed teaching of fabricating HTS coils from HTS tape is described in U.S. Pat. No. 6,943,550 and the disclosure of which is incorporated herein by reference.

Figure 2B:
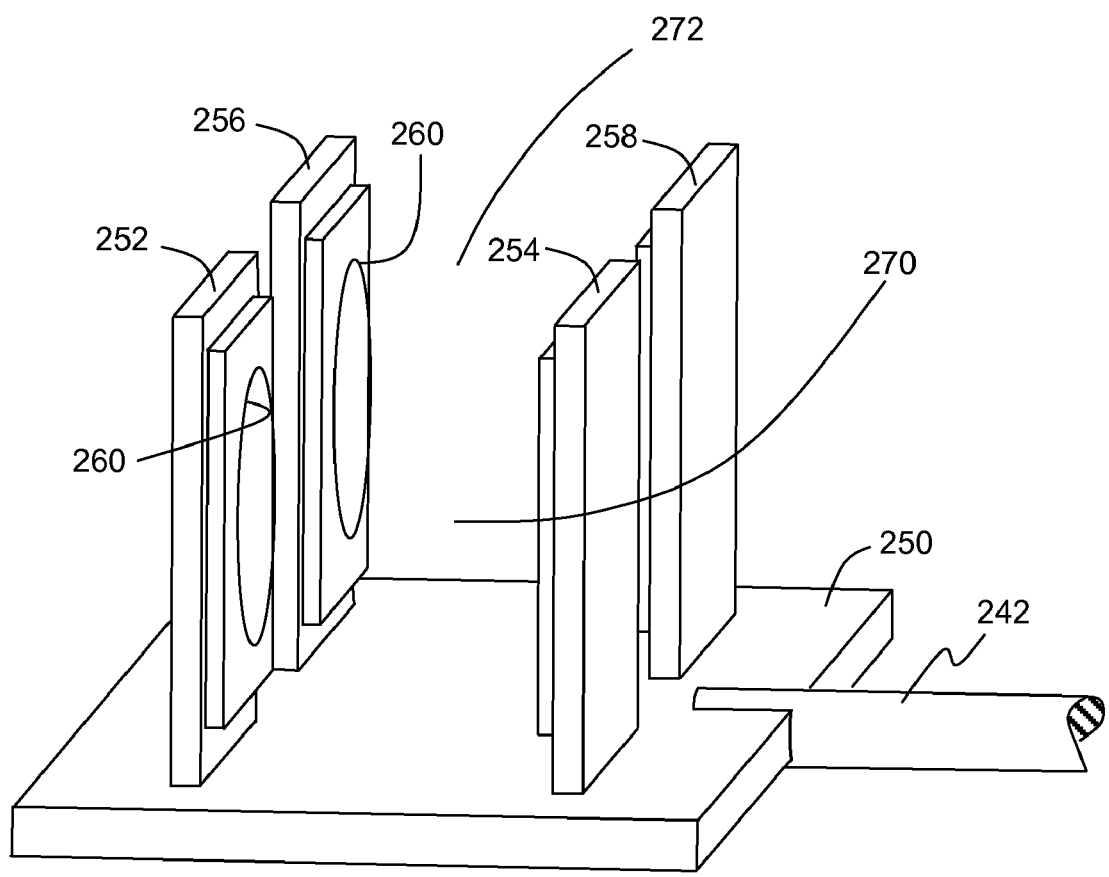
FIG. 2B shows an alternative design of the heat sink assembly and superconductor RF coils for local examination regions in accordance with one embodiment of the present invention.

In an alternative embodiment, the superconductor RF coil is made by superconductor thin film. The superconductor thin film is composed of high temperature superconductor materials such as Yttrium Barium Copper Oxide (YBCO), Thallium-Barium-Calcium-Copper Oxide (TBCCO), $MgB_2$, or MB compound wherein M is selected from the group consisting of Be, Al, Nb, Mo, Ta, Ti, Hf, V, and Cr. Detailed teaching of fabricating HTS film coil on a flat substrate is described in Ma et al, "Superconducting MR Surface Coils for Human Imaging," Proc. Mag. Res. Medicine, 1, 171 (1999) and the disclosure of which is incorporated herein by reference. Since the superconductor film is formed on a flat surface of a lattice matched crystal, the surface of the heat sink needs to be flat. FIG. 2B shows a heat sink assembly having a base plate 250 supporting two pairs of vertically mounted heat sink plate 252, 254, 256, and 258. Each of the heat sink plate hosts a coil plate with a superconductor thin film coil 260. For a given pair, the regions between the plate 252 and 254 and 256 and 258 form local examination region 270 and 272 respectively. The heat sink assembly with the RF coils are disposed in the low vacuum space, between the inner and outer high vacuum enclosures.

It is advantageous to combine a low vacuum space with a high vacuum jacket for the vacuum thermal isolation housing. The hermetically sealed high vacuum jacket provides a means for an excellent thermal insulating with a minimum heat leak, yet it is compact and readily to be constructed. The low vacuum space provides further thermal isolation while hosts the superconductor RF coil. It is much convenient to select various materials suitable for the heat sink assembly and the RF coils in a low vacuum environment.

The system shown in FIGS. 1 and 2 can be readily modified for single breast imaging, wherein the vacuum thermal isolation housing comprises one inner and an outer high vacuum enclosures and provides one examination region that is surrounded by the superconductor coil located in the low vacuum space between the inner and outer high vacuum enclosures.

Figure 3A:
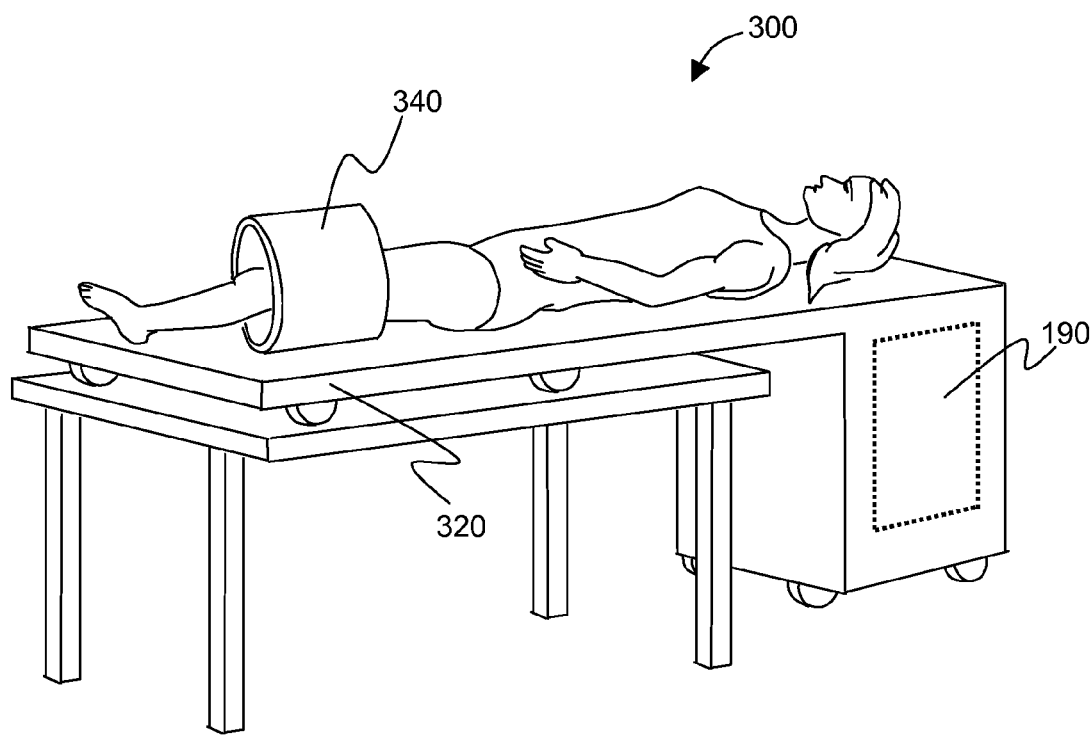
FIG. 3 illustrates an MRI apparatus for knee imaging in accordance with one embodiment of the present invention.

The basic principle and structure of the MRI apparatus shown in FIGS. 1 and 2 can be utilized for various types of imaging systems including foot, knee, wrist, hand, neck, and head imaging. FIG. 3A illustrates an exemplary MRI apparatus for knee imaging. The apparatus 300 includes a main magnet (not shown) and a movable patient bed 320. Similarly to the movable bed 120, the cryogenic system 190 and the heat pipe 160 (not shown) is embedded within the bed 320. A vacuum thermal insulation housing 340 is mounted on the bed that can be moved in and out the main magnetic field. The vacuum thermal insulation housing is coupled to the cryogenic system through the heat pipe. A vacuum pump is also connected to the housing.

Figure 3B:
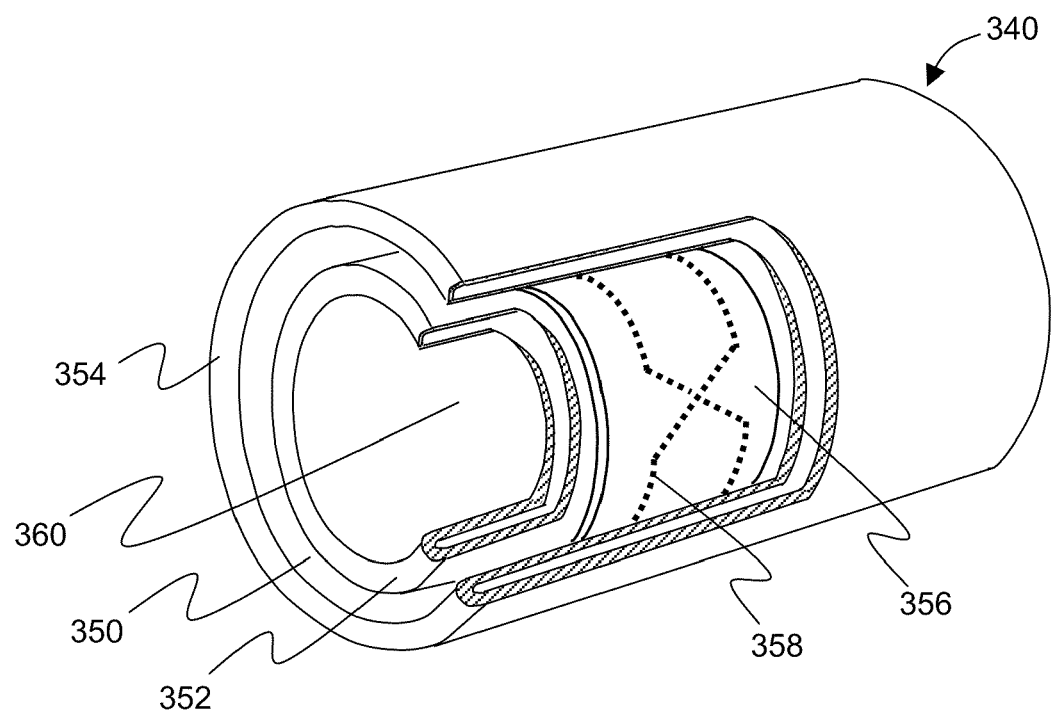

FIG. 3B shows one embodiment of the vacuum housing 340. The low vacuum space 350 is formed between a hermetically sealed inner and outer high vacuum jacket 352 and 354. The low vacuum space can be sealed off at both ends by O-rings, gaskets, grease, or epoxy, except leaving feed through for vacuum line, electrical connection, and the heat pipe to access the low vacuum space (not shown). The low vacuum space hosts a cylindrical heat sink 356 contacting at least one superconductor RF coil 358 which is preferably mounted on the inner surface of the heat sink. The heat sink is connected to the heat pipe by a cold head. The space 360 enclosed by the inner high vacuum jacket forms the local examination region for knee imaging.

Figure 3C:
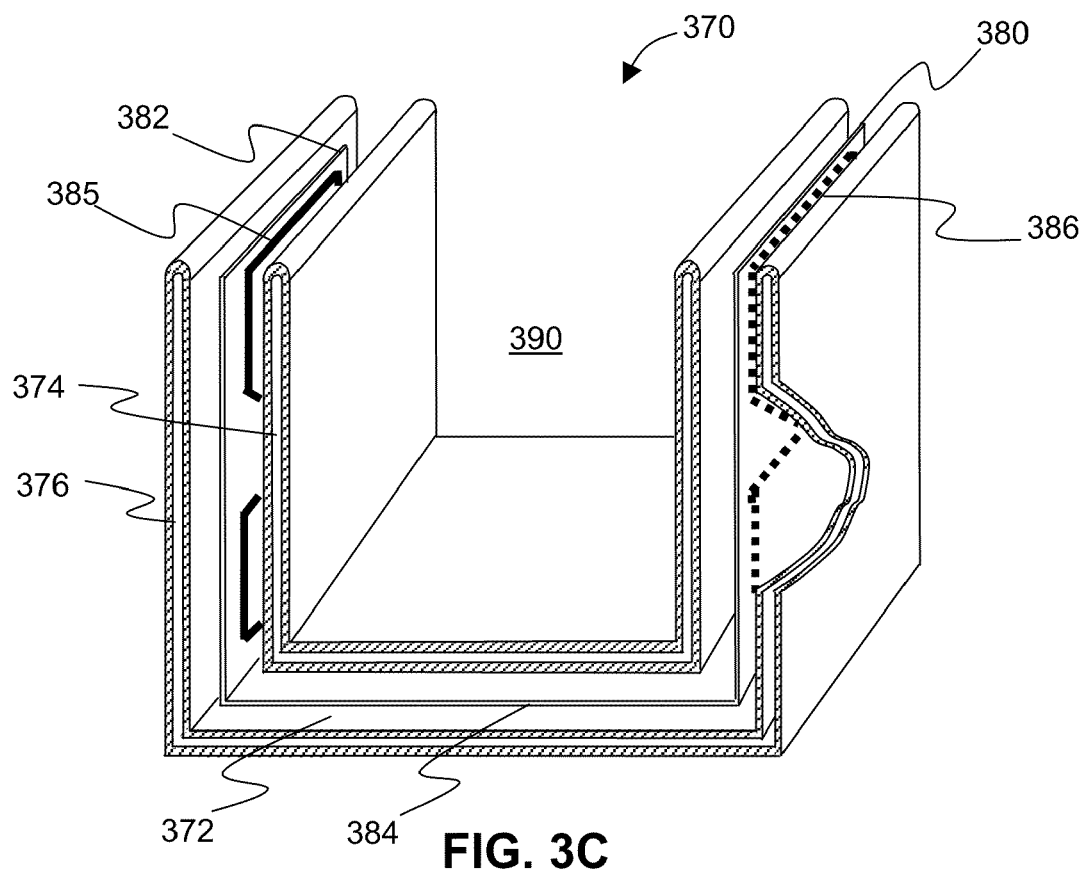

In an alternative embodiment, the superconductor RF coil is made by superconductor thin film. FIG. 3C shows an alternative vacuum thermal insulation housing 370 for knee imaging comprising a low vacuum space 372 between a hermetically sealed inner and an outer high vacuum jacket 374 and 376 respectively. The low vacuum space 372 hosts at least two flat blocks of heat sink 380 and 382 that are mounted on a thermal conductor 384 and coupled to the heat pipe by a cold head. HTS thin film coil 385 and 386 are disposed on the heat sinks. The region 390 between the heat sinks forms the local examination region for knee imaging.

Figure 4A:
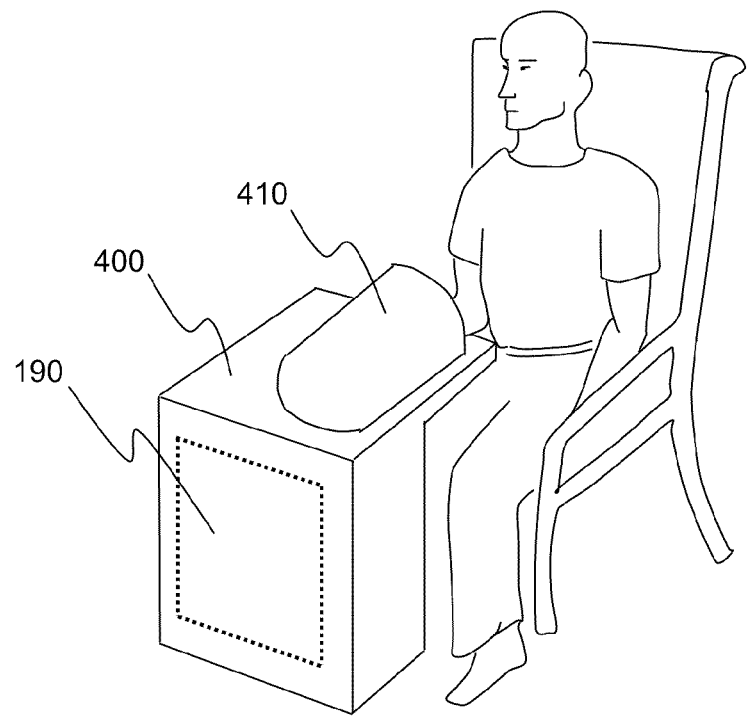
FIG. 4 illustrates an MRI apparatus for hand imaging in according to one embodiment of the present invention.

In accordance with one embodiment of the present invention, the thermal vacuum isolation housing hosting at least one superconductor RF coil is integrated with a cryogenic system for hand or wrist MRI imaging. FIG. 4A illustrates a configuration of an MRI apparatus for hand or wrist imaging. The thermal vacuum isolation housing 410 is mounted on a rack 400 containing the cryogenic system 190. The rack can be moved in and out the main magnet field (the main magnetic system is not shown in this figure.) During an imaging procedure, a patient is seating on a chair and resting a hand inside the local examination region (450 in FIG. 4B).

Figure 4B:
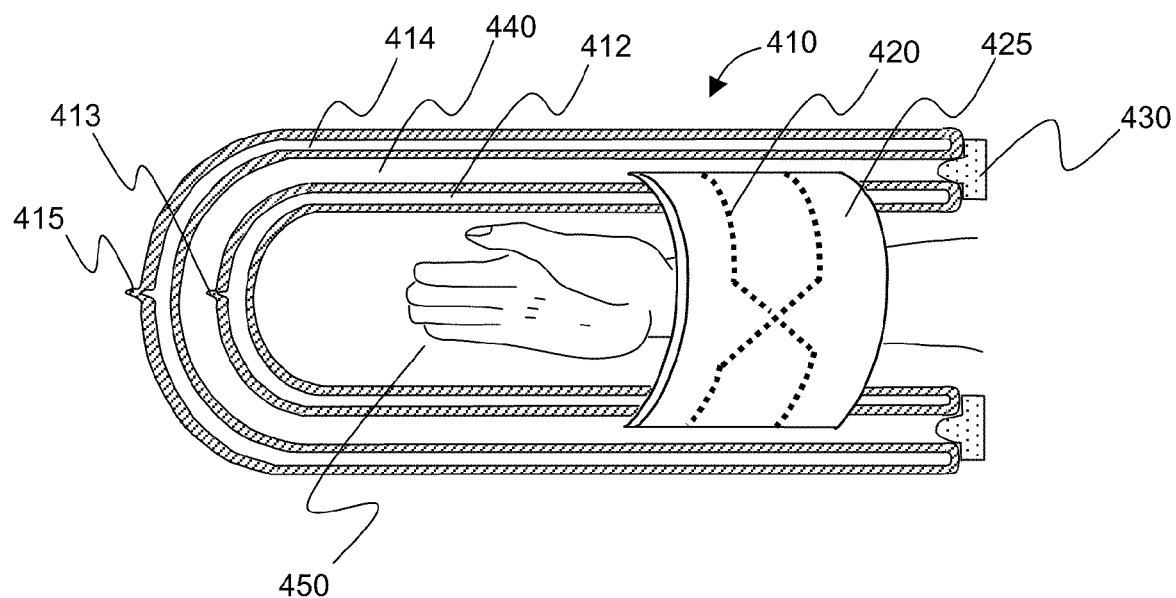

FIG. 4B shows an exemplary construction of the thermal vacuum isolation housing 410. An inner and outer high vacuum enclosure 412 and 414 are formed by hermetically sealed cylindrical shells with one end closed. The structure can be made by blowing glassware in a mold with the shape shown in FIG. 4B followed by pumping air out of the shell from an outlet at the end 413 and 415 which is sealed of after reaching a desired pressure. At least one superconductor RF coil 420 is mounted on a surface (preferably the inner surface) of a cylindrical heat sink 425 which is disposed between the inner and outer high vacuum enclosure (low vacuum space 440). The heat sink is coupled to the heat pipe by a cold head (not shown). There are discrete thermal insulating spacers to hold the heat sink between the inner and outer high vacuum enclosure. The open end of the low vacuum space is sealed by an O-ring 430 except leaving feed through for a vacuum line, electrical connection, and the heat pipe to access the low vacuum space. The space 450 inside the inner high vacuum enclosure is the local examination region for the hand or wrist imaging.

Figure 5A:
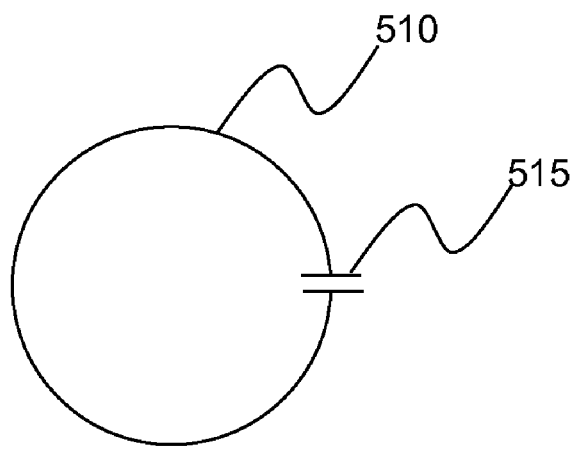
FIG. 5 shows various designs of superconductor RF coils.

In most MRI clinical applications, the operating frequency of RF coils is low, ranging from a several mega Hertz to 100 MHz. In order to obtain such a low resonant frequency, the coil should have enough inductance and capacitance. A basic RF coil circuit is formed by a superconductor conductor loop 510 with a resonating capacitor 515 connected in serial, as shown in FIG. 5A.

The superconductor RF coil or an array of superconductor RF coils is a radio-frequency transmitter, and excites a part of the patient body to emit nuclear magnetic resonance signals. The other superconductor RF coil or an array of superconductor RF coils is a receiver coil to receive magnetic resonance signals from the patient. In some design, one superconductor RF coil or an array of superconductor RF coils is a radio-frequency transmitter exciting a part of the patient body to emit nuclear magnetic resonance signals, and the same superconductor RF coil or an array of superconductor RF coils acts as a receiver coil to receive magnetic resonance signals from the patient. In this kind of design the superconductor RF coil is a transceiver coil to transmit and receive radio-frequency signals.

The RF coil can be made by superconductor tape, superconductor thick film and thin film, or non-superconductive material such as copper. However, superconducting RF coil can enable a dramatic improvement in SNR at a given field strength as described earlier. For example, at 3 T, a superconducting coil can produce image resolutions comparable to conventional systems outputting at a higher field, such as 6 T field. Alternately, superconducting coil technology can be used to lower the cost of producing a given image resolution by enabling image production with a lower magnetic field strength. For example, a lower cost 0.3 T superconducting MRI can generate images comparable in quality and resolution to those produced by a higher cost, conventional 1 T system.

In general, the direction of the static magnetic field generated by the main magnet is in parallel with the direction of the axis of the thermal vacuum isolation housing, which is in horizontal direction. The direction of the field of RF signal needs to be perpendicular to the main field. FIGS. 5B, 5C, 5D, 5E and 5F provide several examples of the superconductor RF coil design to fulfill this requirement.

Figure 5B:
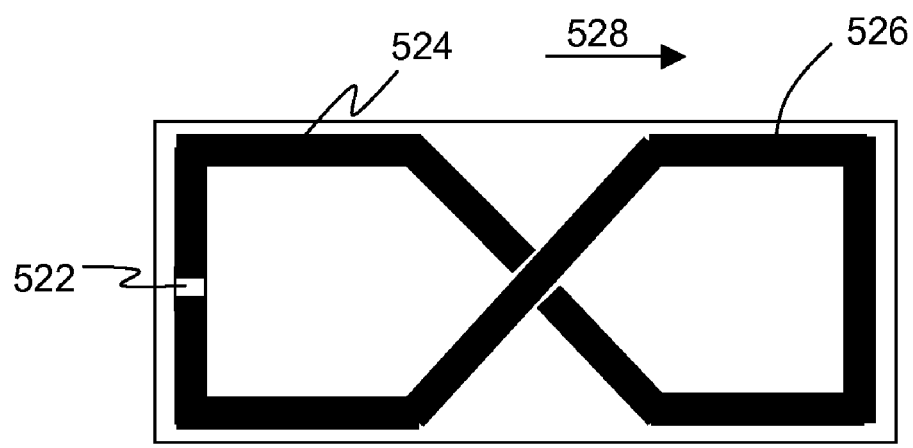
Figure 5C:
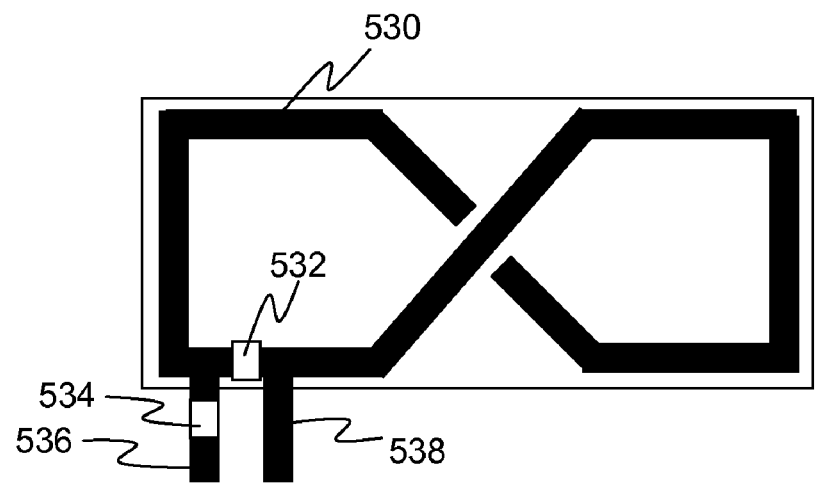
Figure 5D:
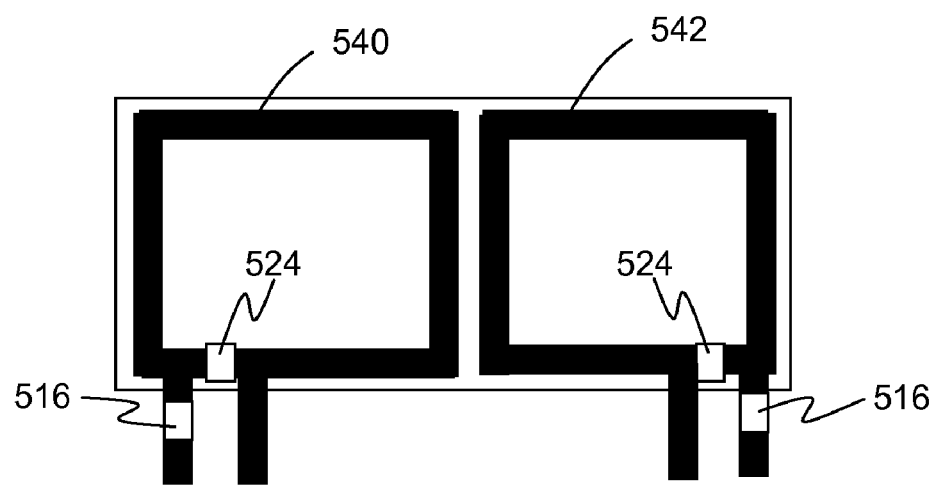
Figure 5E:
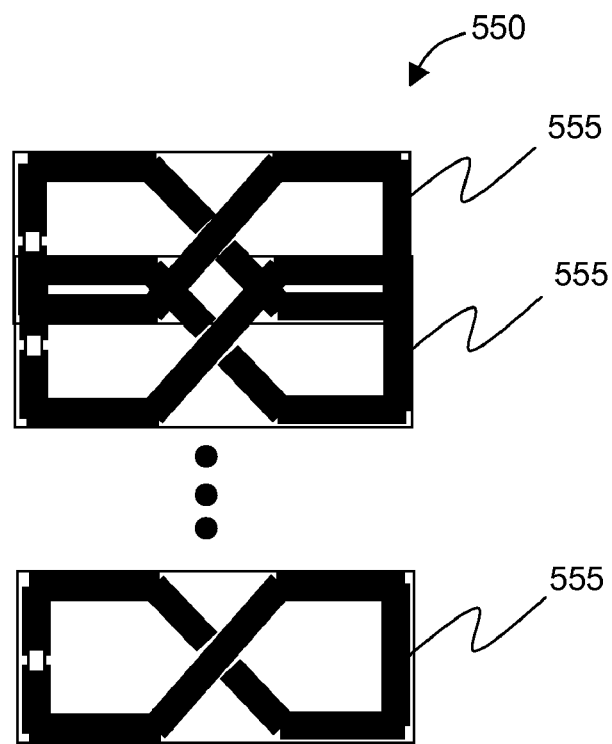
Figure 5F:
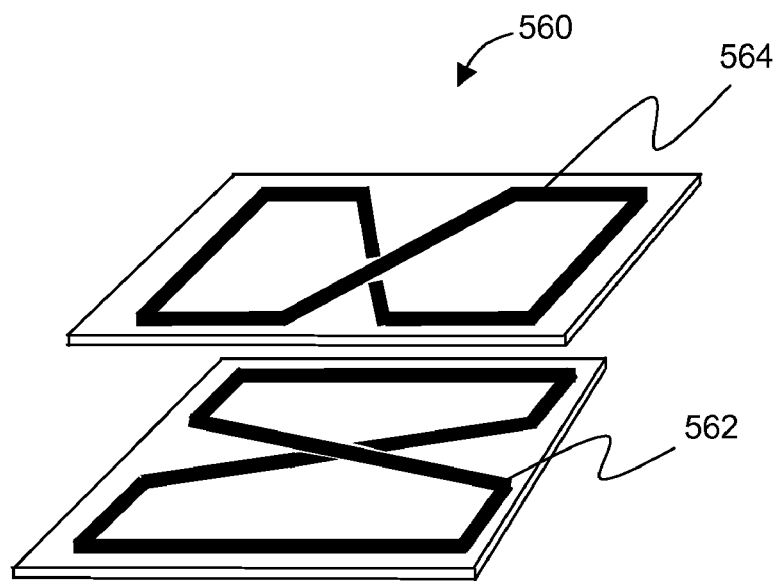

FIG. 5B shows a saddle coil comprising a superconductor coil connected in serial with a resonating capacitor 522. The coil has a left loop 524 and a right loop 526. A typical diameter of the loop is in a range of 1-10 inches. If a current flow in the left loop is clockwise, it will be counter-clockwise in the right loop, which provides the field direction 528. An alternative saddle coil is illustrated in FIG. 5C. The superconductor loop 530 is connected in serial with a primary resonating capacitor 532. In addition, a matching capacitor 534 connects an end terminal 536 to the superconductor coil to provide a method to transmit the RF signal between the coil and the preamplifier of the MRI scanner. Another end terminal 538 connects to the loop directly usually as a ground. FIG. 5D provides two separate RF coils 540 and 542 next to each other on a substrate. Each of the coils includes a resonating capacitor 524 and a matching capacitor 516. Alternatively, an array of more than two coils may be used for this application. FIG. 5E shows an array of saddle coils 550, each coil 555 partially overlap with the neighboring coils. This method decouples noise while increases imaging area. Yet in another embodiment, as shown in FIG. 5F, saddle coils 560 and 562 are arranged 90 degree to each other and they can be driven by two RF signals having a phase difference of 90 degree to improve the SNR of RF signals.

The superconductor coils can be constructed by depositing superconductor materials on a proper substrate which is them mounted on a surface of the heat sink. When the surface of the heat sink is curved, such as a surface of a cylinder, the superconductor coils can be formed on a flexible sheet of non-metallic and non-magnetic material, such as a thin substrate of G10 or mica. The sheet is then attached to the surface of the heat sink.

The integrated MRI imaging systems described above rely on the heat pipe to bridge the cryogenic system and the heat sink. In one embodiment, the heat pipe is formed by a vacuum sleeve 240 that surrounds an elongated heat conductor 242 as shown in FIG. 2A. The vacuum sleeve may joint the low vacuum space of the thermal vacuum isolation housing. Alternatively, the vacuum sleeve is formed by a hermetically sealed high vacuum jacket. One end of the heat conductor is coupled to the plate of the heat sink assembly. The other end of the heat pipe connects to the heat exchanger 192. The heat pipe is used to conduct the heat from the heat sink to the heat exchanger efficiently. In one embodiment, the heat conductor is constructed by an elongated housing containing a mixture of a working fluid and its vapor such as liquid helium or nitrogen and their vapor. The hot end or the heat sink end is lower than the cold end or the heat exchanger end as illustrated in FIG. 1. When the vapor media is cooled at the heat exchanger end and turned to liquid, the liquid flows to the lower end of the heat pipe and reaches the heat sink, where the liquid absorbs heat and turns to vapor. The vapor flows to the higher end of the heat pipe where it loses the heat to the heat exchanger and turns to liquid again, as a cooling cycle. Alternatively the heat pipe can be a solid rod, such as a copper, sapphire, ceramic, or a copper braid. The hot end of the heat pipe can be as high as or higher than the cold end. In such a case, inside the heat pipe's wall an optional wick structure exerts a capillary pressure on the liquid phase of the working fluid. The wick material is typically a sintered metal powder or a series of grooves parallel to the pipe axis to wick the condensed liquid back to the heated end.

The heat exchange 192 is good thermal conductor between the heat pipe and the cryocooler. The heat exchanger can also be a part of the heat pipe or cryocooler. In one embodiment, the heat exchanger is a copper container as a storage tank of working media. In an alternative embodiment, the heat exchanger is a copper block which makes good thermal conduction between the heat pipe and the cryocooler.

The cryocooler 194 is made of non- or weak-magnetic material, such as stainless steel, aluminum, copper, titanium, beryllium, and their alloys. In one embodiment, the cryocooler is a pulse tube cryogenic cooler. A pulse tube cooler is a closed system that uses an oscillating gas pressure at one end (typically produced by a compressor) to generate an oscillating gas flow in the rest of the system. This gas flow (usually helium gas) can carry heat away from a low temperature point (cold heat exchanger). The pulse tube cooler comprises a regenerator, a cold heat exchanger, a hot heat exchanger, and a pulse tube section. The regenerator is a kind of heat exchanger that provides a way to get the gas to the low temperature region with as much potential work (cooling power) as possible without carrying a lot of heat with it. The cold heat exchanger is the coldest point of the system; it is here that heat is put into the system from the load to be cooled. The pulse tube section provides a way for the gas flow to do its cooling. The hot heat exchanger is used to remove the heat carried through the pulse tube section from the cold end. A single cooler can cool from room temperature to 30 K and multi-stage systems can cool the temperature to much lower level. The amount of heat they can remove is limited by their size and the power used to drive them. The primary advantage of pulse tube coolers is that they have no moving parts in the low-temperature region. Additional advantages of the coolers are high efficiency, high reliability, small size, and avoiding the liquid refill. Although, this type of cooling system usually only reaches a temperature in the 60K range (single stage), this temperature range is suitable for superconductor RF coil materials. The cold head is made of a non-magnetic material so that it can be used inside or close to an MRI machine.

Alternatively, the cryocooler can be selected from the group comprising Gifford McMahon cryocooler, TJ cooler, sterling cooler.

The foregoing examples illustrate certain exemplary embodiments from which other embodiments, alternatives, variations, and modifications will be apparent to those skilled in the art. Accordingly, the invention is intended to embrace all other such alternatives, modifications, and variations that fall within the spirit and scope of the appended claims.

What is claimed is:

1. A magnetic resonance imaging (MRI) apparatus comprising: an examination region, at least one vacuum thermal isolation housing, a main magnet system for generating a main magnetic field in the examination region, and a cryogenic system integrated with the vacuum thermal isolation housing;
    wherein the vacuum thermal isolation housing comprises a low vacuum space maintained at a pressure between $10^{-3}$ to $10^{-6}$ Torr, at least one superconductor RF coil, a heat sink assembly, and at least one inner and an outer high vacuum enclosures; wherein the high vacuum enclosure comprises a double wall hermetically sealed high vacuum jacket at a pressure of $10^{-6}$ to $10^{9}$ Torr;
    said vacuum thermal isolation housing provides at least one local examination region that is substantially surrounded by the superconductor RF coil; said low vacuum space, which is between the inner and the outer high vacuum enclosures, hosts the at least one superconductor RF coil that is in thermal contact with the heat sink assembly; said heat sink assembly is coupled to the cryogenic system through a heat pipe to achieve and maintain a desired low temperature at the superconductor RF coil.

2. The MRI apparatus of claim 1 further comprising a patient support, the vacuum thermal isolation housing is embedded within the patient support for breast imaging.

3. The MRI apparatus of claim 2 comprises two inner high vacuum enclosures to provide two local examination regions for imaging both breasts.

4. The MRI apparatus of claim 1, the vacuum housing is constructed for imaging a body part selected from the group consisting of knee, wrist, hand, foot, neck, and head.

5. The MRI apparatus of claim 1, wherein the low vacuum space is connected to a vacuum pumping line and is sealed by an O-ring, gasket, or epoxy for a desired pressure.

6. The MRI apparatus of claim 1, wherein the double wall is made of a non-magnetic insulating material selected from the group consisting of G10 fiberglass, glass, and glass composite.

7. The MRI apparatus of claim 1, wherein the width of the high vacuum jacket is in the range of 1 mm to 100 mm.

8. The MRI apparatus of claim 1 further comprising a cold head joining the heat sink assembly and the heat pipe to maintain a desired low temperature at the RF coil.

9. The MRI apparatus of claim 6, wherein the cold head is made of a copper block.

10. The MRI apparatus of claim 1, wherein the heat sink is made from at least one non-magnetic material selected from the group consisting of ceramic, plastic, crystal, metal, and glass.

11. The MRI apparatus of claim 8, wherein the crystal is sapphire.

12. The MRI apparatus of claim 8, wherein the ceramic is alumina.

13. The MRI apparatus of claim 1, wherein the heat pipe is constructed by an elongated housing containing a mixture of a working fluid and its vapor; said elongated housing is surrounded by a vacuum sleeve.

14. The MRI apparatus of claim 1, wherein the heat pipe is constructed by a rod made from at least one material selected from the group consisting of copper, copper braid, sapphire, and ceramic; said rod is surrounded by a vacuum sleeve.

15. The MRI apparatus of claim 1, the cryogenic system includes a heat exchanger, a cooler, and a compressor package.

16. The MRI apparatus of claim 13, the cooler is selected from the group consisting of a pulse tube cryogenic cooler, Gifford McMahon cooler, TJ Cooler, and sterling cooler.

17. The MRI apparatus of claim 1, wherein the superconductor RF coil is made of a high temperature superconductor thin film.

18. The MRI apparatus of claim 1, wherein the superconductor RF coil is made of a high temperature superconductor tape or cable.

19. The MRI apparatus of claim 1, wherein the superconductor RF coil comprises at least one superconductor material selected from the group consisting of YBaCuO, BiSrCaCuO, TlBiCaCuO, and $MgB_2$ compound.

20. The MRI apparatus of claim 1, wherein the superconductor RF coil is a radio-frequency transmitter to excite a part of the patient body to emit nuclear magnetic resonance signals.

21. The MRI apparatus of claim 1, wherein the superconductor RF coil is a receiver coil to receive magnetic resonance signals from the patient.

22. The MRI apparatus of claim 1, wherein the superconductor RF coil is a transceiver coil to transmit and receive radio-frequency signals.

23. The MRI apparatus of claim 1 further comprises a gradient coil which is substantially situated between the main magnet system and the examination region to tune the main magnetic field in the examination region.

24. The MRI apparatus of claim 1, wherein the superconductor RF coil comprises at least one loop with a diameter of 1 to 10 inch.

25. The MRI apparatus of claim 1, wherein at least one superconductor RF coil is in a form of a quadrature coil or an array of coils.

26. The MRI apparatus of claim 1, wherein the superconductor RF coil is a multi-channel array coil. Each channel is a single loop coil which is decoupled with every other coil.

27. The MRI apparatus of claim 2, wherein the patient support system is a movable bed.

28. The MRI apparatus of claim 27, wherein at least a portion of the cryogenic system is movable with the patient bed.

29. The MRI apparatus of claim 1, wherein the vacuum housing and the cryogenic system are supported by a rack.

* * * * *